US009601572B2

(12) United States Patent
Takeda et al.

(10) Patent No.: US 9,601,572 B2
(45) Date of Patent: *Mar. 21, 2017

(54) SEMICONDUCTOR DEVICE FOR REDUCING GATE WIRING LENGTH

(71) Applicant: JTEKT CORPORATION, Osaka-shi, Osaka (JP)

(72) Inventors: Yasuhide Takeda, Nissin (JP); Yasuyuki Wakita, Kashihara (JP); Masaya Segawa, Nara (JP); Shigeki Nagase, Nabari (JP)

(73) Assignee: JTEKT CORPORATION, Osako (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/681,662

(22) Filed: Apr. 8, 2015

(65) Prior Publication Data

US 2015/0295043 A1    Oct. 15, 2015

(30) Foreign Application Priority Data

Apr. 14, 2014   (JP) ................................. 2014-083006

(51) Int. Cl.
*H01L 29/423*      (2006.01)
*H01L 29/66*       (2006.01)
(Continued)

(52) U.S. Cl.
CPC .......... *H01L 29/0696* (2013.01); *H01L 24/05* (2013.01); *H01L 24/06* (2013.01); *H01L 24/49* (2013.01); *H01L 29/4236* (2013.01); *H01L 29/4238* (2013.01); *H01L 29/42372* (2013.01); *H01L 29/66704* (2013.01);
(Continued)

(58) Field of Classification Search
CPC ........... H01L 29/4236; H01L 29/66704; H01L 29/66734; H01L 29/7397; H01L 29/7825
See application file for complete search history.

(56) References Cited

U.S. PATENT DOCUMENTS 4,914,058 A * 4/1990 Blanchard ......... H01L 29/42312
148/DIG. 126
5,168,331 A    12/1992 Yilmaz
(Continued)

FOREIGN PATENT DOCUMENTS

GB          2082385 A      3/1982
JP       H05-63098 B2      9/1993
(Continued)

OTHER PUBLICATIONS

Sep. 15, 2015 Extended Search Report in European Patent Application No. 15163001.9.
(Continued)

*Primary Examiner* — Phat X Cao
(74) *Attorney, Agent, or Firm* — Oliff PLC

(57) ABSTRACT

A gate pad and a source pad are disposed on a semiconductor layer. The gate pad is disposed at the center portion of the semiconductor layer and has the shape of a circle centered on the center of the semiconductor layer as viewed in plan. The source pad is disposed so as to surround the gate pad, and has the shape of a circular ring centered on the center of the semiconductor layer as viewed in plan. A plurality of unit cells that compose a trench type MOSFET element are formed in the semiconductor layer.

2 Claims, 10 Drawing Sheets

(51) Int. Cl.
  *H01L 29/06* (2006.01)
  *H01L 29/78* (2006.01)
  *H01L 29/739* (2006.01)
  *H01L 23/00* (2006.01)

(52) U.S. Cl.
  CPC .... *H01L 29/66734* (2013.01); *H01L 29/7395* (2013.01); *H01L 29/7397* (2013.01); *H01L 29/78* (2013.01); *H01L 29/7802* (2013.01); *H01L 29/7813* (2013.01); *H01L 24/48* (2013.01); *H01L 24/73* (2013.01); *H01L 2224/04042* (2013.01); *H01L 2224/05555* (2013.01); *H01L 2224/0603* (2013.01); *H01L 2224/32225* (2013.01); *H01L 2224/48091* (2013.01); *H01L 2224/48227* (2013.01); *H01L 2224/48472* (2013.01); *H01L 2224/49111* (2013.01); *H01L 2224/49175* (2013.01); *H01L 2224/73265* (2013.01); *H01L 2924/00014* (2013.01); *H01L 2924/10156* (2013.01); *H01L 2924/13055* (2013.01); *H01L 2924/13091* (2013.01)

(56) References Cited

U.S. PATENT DOCUMENTS

| | | | |
|---|---|---|---|
| 5,321,289 A | 6/1994 | Baba et al. | |
| 5,376,815 A | 12/1994 | Yokota et al. | |
| 5,539,232 A * | 7/1996 | Nakanishi | H01L 23/4824 257/153 |
| 6,054,748 A | 4/2000 | Tsukuda et al. | |
| 6,337,498 B1 * | 1/2002 | Hasegawa | H01L 29/0696 257/328 |
| 6,462,376 B1 | 10/2002 | Wahl et al. | |
| 6,576,936 B1 * | 6/2003 | Bauer | H01L 23/4824 257/133 |
| 2010/0187640 A1 | 7/2010 | Miyata | |
| 2011/0017998 A1 * | 1/2011 | Nakano | H01L 21/046 257/66 |
| 2015/0295044 A1 * | 10/2015 | Takeda | H01L 29/0696 257/139 |

FOREIGN PATENT DOCUMENTS

| | | |
|---|---|---|
| JP | 2001-102576 A | 4/2001 |
| JP | 2005-033073 A | 2/2005 |
| JP | 2009-064995 A | 3/2009 |
| WO | 2005/112128 A2 | 11/2005 |

OTHER PUBLICATIONS

Sep. 15, 2015 Extended Search Report issued in European Patent Application No. 15163002.7.
U.S. Appl. No. 14/681,779, filed Apr. 8, 2015 in the name of Takeda et al.
Feb. 10, 2016 Office Action issued in U.S. Appl. No. 14/681,779.
Aug. 17, 2016 Office Action Issued in U.S. Appl. No. 14/681,779.

* cited by examiner

SEMICONDUCTOR DEVICE FOR REDUCING GATE WIRING LENGTH

INCORPORATION BY REFERENCE

The disclosure of Japanese Patent Application No. 2014-083006 filed on Apr. 14, 2014 including the specification, drawings and abstract, is incorporated herein by reference in its entirety.

BACKGROUND OF THE INVENTION

1. Field of the Invention

The present invention relates to a semiconductor device for use in an inverter circuit for driving a motor or the like.

2. Description of the Related Art

A semiconductor device in which a transistor element such as a metal oxide semiconductor field effect transistor (MOSFET) element or an insulated gate bipolar transistor (IGBT) element is formed is known as a semiconductor device for use in an inverter circuit for driving a motor or the like. The semiconductor device according to the related art in which the MOSFET element is formed has a rectangular shape as viewed in plan. A source pad and a gate pad are formed on one surface of the semiconductor device. A drain electrode is formed on the other surface of the semiconductor device. The source pad is formed so as to cover substantially the entire surface of the semiconductor device. The gate pad is formed at one corner portion of the surface of the semiconductor device, or at the center portion of an edge portion along one side of the surface of the semiconductor device.

In the case where the semiconductor device in which the MOSFET element is formed is caused to function as an electronic circuit such as an inverter circuit, a plurality of semiconductor devices are mounted on a wiring substrate on which wiring is formed in advance. The semiconductor device is attached to the wiring substrate with a drain electrode of the semiconductor device joined to a drain metal pattern on the wiring substrate by solder. A gate pad of the semiconductor device is connected to a gate metal pattern on the wiring substrate by a connection metal member such as a bonding wire. A source pad of the semiconductor device is connected to a source metal pattern on the wiring substrate by a connection metal member. Connection through the connection metal member is achieved by a bonding device such as a wire bonding device (see Japanese Patent Application Publication No. 2001-102576 (JP 2001-102576 A), Japanese Patent Application Publication No. 2005-33073 (JP 2005-33073 A), Japanese Examined Patent Application Publication No. 5-63098 (JP 5-63098 B), and Japanese Patent Application Publication No. 2009-64995 (JP 2009-64995 A)).

When joining the drain electrode of the semiconductor device to the drain metal pattern using solder, the solder in the molten state may flow to rotate the semiconductor device on the metal pattern. In the semiconductor device according to the related art discussed above, in the case where the semiconductor device is rotated when joining the semiconductor device to the drain metal pattern, the positions of a region of the semiconductor device provided with the gate pad and a region of the semiconductor device provided with the source pad with respect to the drain metal pattern are varied. Then, the position of bonding the connection metal member to the gate pad and the source pad (the bonding coordinate set to the bonding device) must be corrected in accordance with the rotation of the semiconductor device, which reduces the bonding work efficiency.

SUMMARY OF THE INVENTION

It is an object of the present invention to provide a semiconductor device that eliminates the need to correct the position of bonding a connection metal member to a gate pad and a main electrode pad as much as possible even in the case where the semiconductor device is rotated when mounting the semiconductor device onto a substrate.

An aspect of the present invention provides a semiconductor device including: a semiconductor layer; a plurality of unit cells formed in the semiconductor layer to each compose a transistor element that is either a metal oxide semiconductor (MOS) field effect transistor element or an insulated gate bipolar transistor element; a gate pad disposed on the semiconductor layer and having a shape of a circle centered on a center of the semiconductor layer as viewed in plan from a thickness direction of the semiconductor layer; and a main electrode pad disposed on the semiconductor layer so as to surround the gate pad and having a shape of a circular ring centered on the center of the semiconductor layer as viewed in plan.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

An embodiment of the present invention will be described in detail below with reference to the accompanying drawings.

Figure 1:
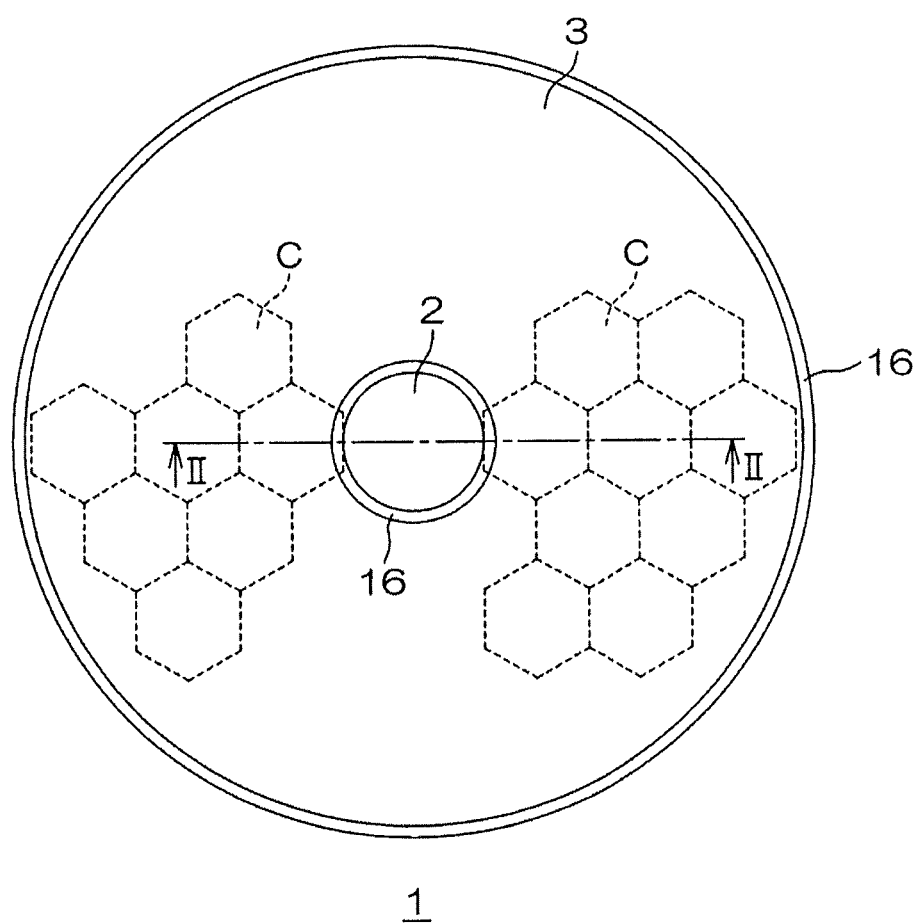
FIG. 1 is a schematic plan view of a semiconductor device according to a first embodiment of the present invention.
Figure 2:
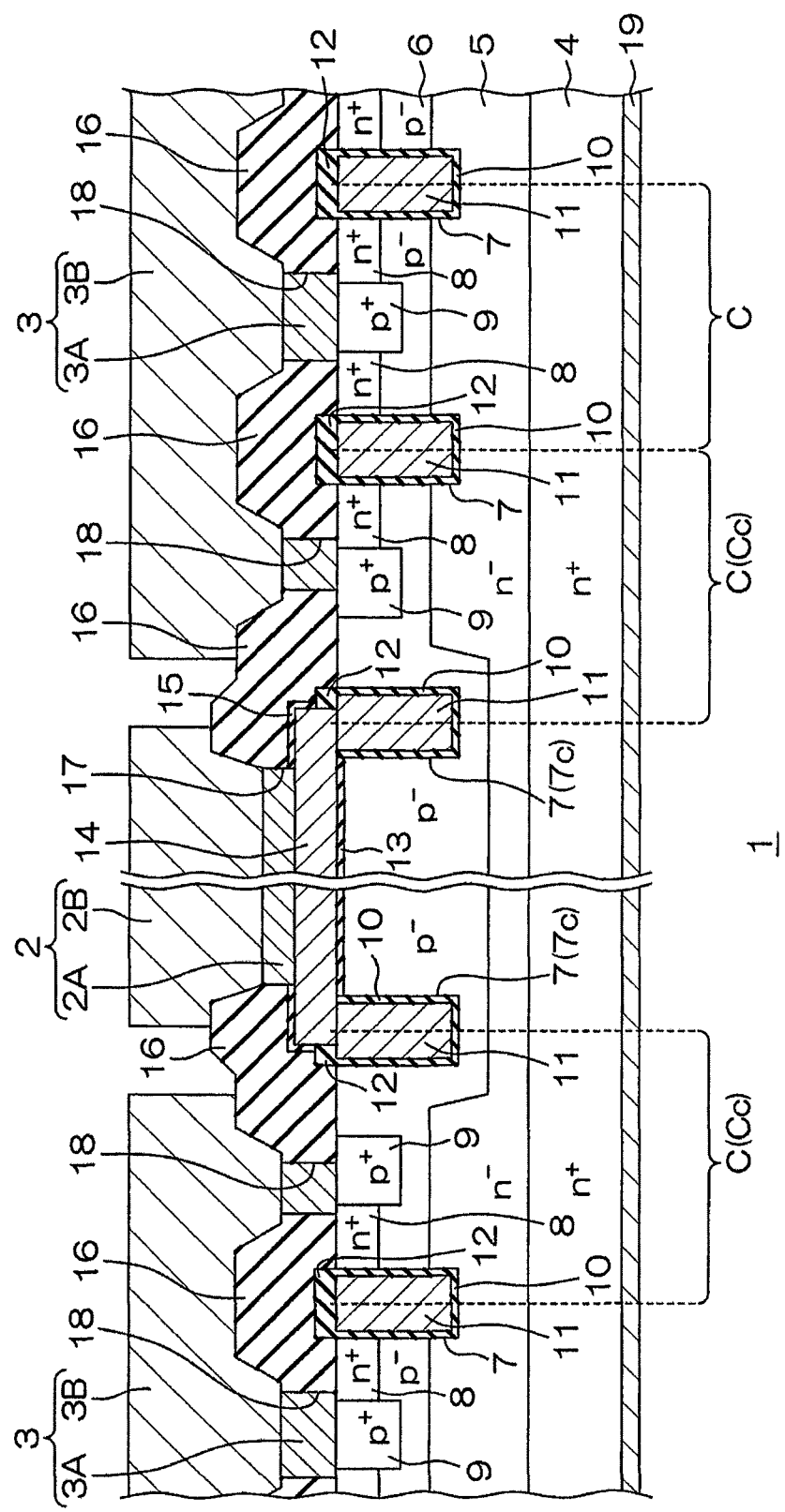
FIG. 2 is a schematic partial enlarged sectional view taken along the line II-II of FIG. 1.
Figure 3:
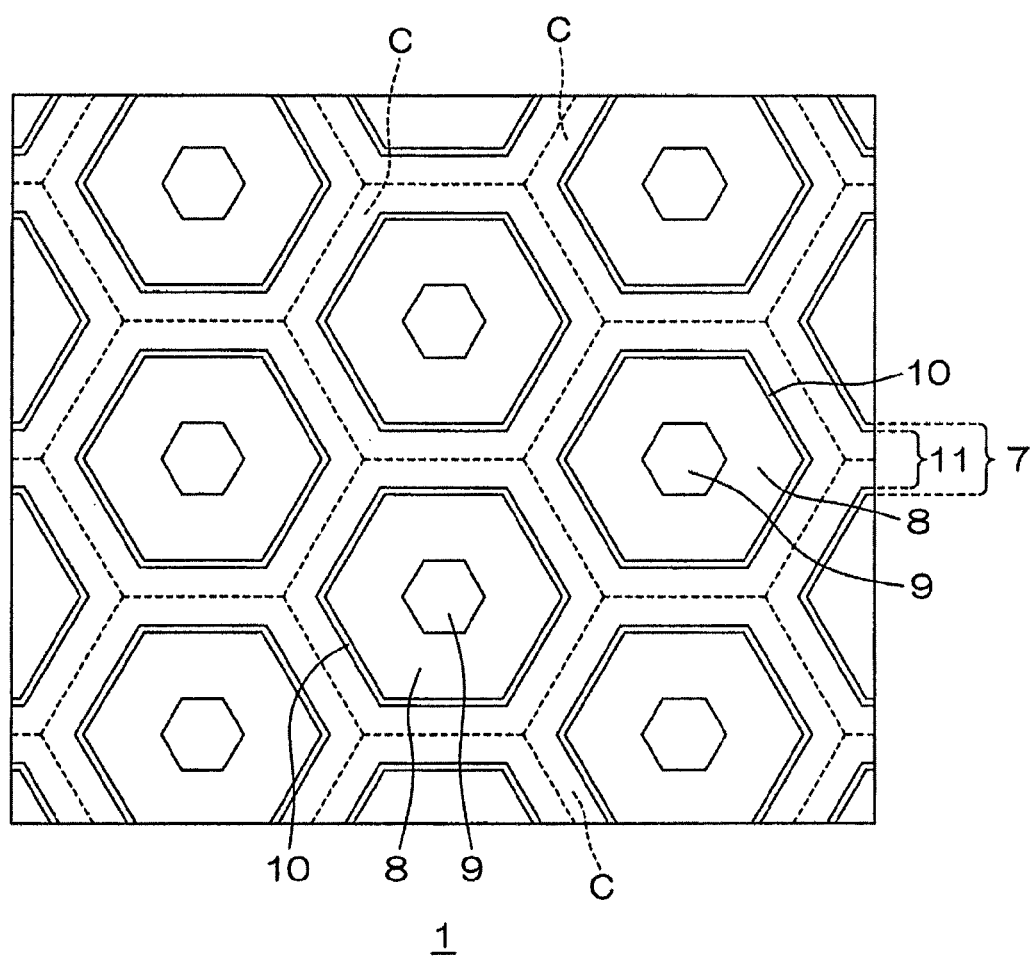
FIG. 3 is a schematic partial enlarged plan view illustrating the layout of unit cells.

FIG. 1 is a schematic plan view of a semiconductor device according to a first embodiment of the present invention. FIG. 2 is a schematic partial enlarged sectional view taken along the line II-II of FIG. 1. FIG. 3 is a schematic partial enlarged plan view illustrating the layout of unit cells. It should be noted, however, that components formed on a p⁻ type body layer 6 (see FIG. 2) are not illustrated in FIG. 3.

A semiconductor device 1 is a trench type MOSFET, and has the shape of a circular chip as viewed in plan. A gate pad 2 is formed at the center portion of the surface of the semiconductor device 1. The gate pad 2 has a circular shape as viewed in plan. The center of the gate pad 2 coincides with the center of the surface of the semiconductor device 1. A source pad 3 is formed on the surface of the semiconductor device 1 so as to surround the gate pad 2. The source pad 3 has a circular ring shape as viewed in plan. The center of the source pad 3 coincides with the center of the surface of the semiconductor device 1. A clearance is provided between the gate pad 2 and the source pad 3 so that the gate pad 2 and the source pad 3 are insulated from each other.

A plurality of unit cells C that compose a trench type MOSFET element are provided below the source pad 3. Each of the unit cells C has a regular hexagonal shape as viewed in plan. The plurality of unit cells C are arranged in the radial direction about the gate pad 2 as viewed in plan. In other words, the plurality of unit cells C are disposed in a honeycomb structure. A unit cell C that is proximate to the gate pad 2, in each row of unit cells disposed in the radial direction about the gate pad 2 as viewed in plan, is occasionally referred to as "center-side unit cell Cc". The actual size of the unit cells C with respect to the semiconductor device 1 is smaller than the size of the unit cells C illustrated in FIG. 1. Thus, the actual number of unit cells C formed in the semiconductor device 1 is much larger than the number of the unit cells C illustrated in FIG. 1.

The semiconductor device 1 includes an n⁺ type substrate 4 made of Si, An n⁻ type epitaxial layer 5 is formed on the surface of the n⁺ type substrate 4. The n⁻ type epitaxial layer 5 is made of Si that is lower in concentration than that of the n⁺ type substrate 4. Further, a p⁻ type body layer 6 is formed on the n⁻ type epitaxial layer 5. The p⁻ type body layer 6 is formed by injecting p type impurities into the n⁻ type epitaxial layer 5, for example. The center region of the p⁻ type body layer 6 including a portion facing the gate pad 2 is formed to be thicker than the other region of the p⁻ type body layer 6.

In the first embodiment, the n⁺ type substrate 4, the n⁻ type epitaxial layer 5, and the p⁻ type body layer 6 compose the "semiconductor layer" according to the present invention. The semiconductor layer has a circular shape as viewed in plan.

Gate trenches 7 dug from the surface of the p⁻ type body layer 6 toward the n⁺ type substrate 4 are formed in the p⁻ type body layer 6 and the n⁻ type epitaxial layer 5. The gate trenches 7 are formed in the shape of a net having meshes in a regular hexagonal ring shape as viewed in plan. Consequently, the plurality of unit cells C separated by the gate trenches 7 are formed in the p⁻ type body layer 6 and the n⁻ type epitaxial layer 5. The unit cells C are surrounded by the gate trenches 7 in a regular hexagonal ring shape as viewed in plan. Gate trenches 7 that are proximate to the gate pad 2 as viewed in plan, among the gate trenches 7 in a regular hexagonal ring shape which separate the center-side unit cells Cc, are occasionally referred to as "center-side trenches 7c". As viewed in plan, the center-side trenches 7c are disposed in a region of a thick portion of the p⁻ type body layer 6, and the gate trenches 7 other than the center-side trenches 7c are disposed in a region of a thin portion of the p⁻ type body layer 6.

An n⁺ type source region 8 is formed in the surface layer portion of the p⁻ type body layer 6 along the gate trenches 7 other than the center-side trenches 7c. The n⁺ type source region 8 is formed along a peripheral edge portion of the surface layer portion of the body layer 6. Thus, in the case where the unit cells C has a regular hexagonal shape as viewed in plan, the n⁺ type source region 8 is formed in a regular hexagonal ring shape as viewed in plan in the unit cells C other than the center-side unit cells Cc. No n⁺ type source region is formed along the center-side trenches 7c. Thus, the n⁺ type source region 8 is formed in a partially missing regular hexagonal ring shape (regular hexagonal ring shape with ends) as viewed in plan in the center-side unit cells Cc.

In the unit cells C other than the center-side unit cells Cc, a p⁺ type contact region 9 is formed in a region surrounded by the n⁺ type source region 8. In the center-side unit cells Cc, a p⁺ type contact region 9 is formed in a region substantially surrounded by the n⁺ type source region 8. The p⁺ type contact region 9 is formed so as to contact the p⁻ type body layer 6.

The gate trenches 7 other than the center-side trenches 7c are formed to extend from the surface of the n⁺ type source region 8 and penetrate the n⁺ type source region 8 and the p⁻ type body layer 6 to reach a depth of the n⁻ type epitaxial layer 5. The depth of the center-side trenches 7c is the same as the depth of the gate trenches 7 other than the center-side trenches 7c. Since the center-side trenches 7c are formed in the thick portion of the p⁻ type body layer 6, however, the deepest end of the center-side trenches 7c is in the p⁻ type body layer 6, and does not reach the n⁻ type epitaxial layer 5.

A gate insulating film 10 is formed on the inner wall surface of the gate trenches 7. The gate insulating film 10 is an oxide silicon film, for example. A gate electrode 11 is embedded in the gate trenches 7 so as to contact the gate insulating film 10. The gate electrode 11 is made of polysilicon doped with impurities, for example. Thus, the gate electrode 11 is spread in the shape of a net having meshes in a regular hexagonal ring shape about a region surrounded by the plurality of center-side trenches 7c as viewed in plan. The gate electrode 11 in a regular hexagonal ring shape as viewed in plan surrounds the p⁻ type body layer 6 of the unit cells C.

An insulating film 12 is formed so as to cover the surface (upper surface) of the gate electrode 11. It should be noted, however, that for the gate electrode 11 in the center-side trenches 7c, the insulating film 12 is formed so as to cover only an edge portion of the surface of the gate electrode 11 that is far from the center of the gate pad 2. The gate insulating film 10 and the insulating film 12 are integrated with each other.

An insulating film 13 is formed in the surface layer portion of the thick portion of the p⁻ type body layer 6 in a region surrounded by the center-side trenches 7c. A gate wiring film 14 is formed on the insulating film 13 and on the surface (a portion not covered with the insulating film 12) of the gate electrode 11 in the plurality of center-side trenches 7c. The gate wiring film 14 connects the gate electrode 11 in the plurality of center-side trenches 7c to the gate pad 2. The gate wiring film 14 is connected to the gate electrode 11 in the plurality of center-side trenches 7c. The gate wiring film 14 is made of polysilicon doped with impurities, for example. An insulating film 15 is formed so as to cover the gate wiring film 14.

An interlayer insulating film 16 is formed so as to cover a part of the n⁺ type source region 8, a part of the p⁺ type contact region 9 in the center-side unit cells Cc, and the p⁻ type body layer 6 and the insulating films 12 and 15, the surface of which is exposed in the center-side unit cells Cc. A gate contact hole 17 is formed in the interlayer insulating film 16 and the insulating film 15 to penetrate the interlayer insulating film 16 and the insulating film 15. The gate contact hole 17 is formed substantially at the center of the gate wiring film 14 as viewed in plan, and formed so as to expose a part of the gate wiring film 14.

A source contact hole 18 is formed in the interlayer insulating film 16 to penetrate the interlayer insulating film 16. The source contact hole 18 is formed substantially at the center of the p⁻ type body layer 6 of each of the unit cells C as viewed in plan. In the center-side unit cells Cc, the source contact hole 18 is formed so as to expose a part of the p⁺ type contact region 9 and a part of the n⁺ type source region 8. In the unit cells C other than the center-side unit cells Cc, the source contact hole 18 is formed so as to expose all of the p⁺ type contact region 9 and a part of the n⁺ type source region 8.

The gate pad 2 and the source pad 3 are formed on the interlayer insulating film 16. In other words, the gate pad 2 and the source pad 3 are disposed on the semiconductor layer 4, 5, 6 composed of the n⁺ type substrate 4, the n⁻ type epitaxial layer 5, and the p⁻ type body layer 6. The gate pad 2 is disposed at the center portion of the semiconductor layer 4, 5, 6, and has a circular shape as viewed in plan. The center of the gate pad 2 coincides with the center of the semiconductor layer 4, 5, 6. The source pad 3 is disposed so as to surround the gate pad 2, and has a circular ring shape as viewed in plan. The center of the source pad 3 coincides with the center of the semiconductor layer 4, 5, 6.

The gate pad 2 contacts the gate wiring film 14 via the gate contact hole 17. The gate wiring film 14 is connected to the gate electrode 11. Thus, the gate pad 2 is electrically connected to the gate electrode 11 which separates the unit cells C. The gate pad 2 is formed of a contact metal 2A and a surface metal 2B that are stacked such that the contact metal 2A is placed on the gate wiring film 14 and the surface metal 2B is placed on the contact metal 2A.

The source pad 3 collectively contacts the p⁺ type contact region 9 and the n⁺ type source region 8 of all the unit cells C via each source contact hole 18. That is, the source pad 3 is common to all the unit cells C. The source pad 3 is formed of a contact metal 3A and a surface metal 3B that are stacked such that the contact metal 3A is placed on the p⁺ type contact region 9 and the n⁺ type source region 8 and the surface metal 3B is placed on the contact metal 3A. The contact metals 2A and 3A of the gate pad 2 and the source pad 3 are an Al/Si stacked film, W (tungsten), an Al/Si/Cu stacked film, or the like, for example. The surface metals 2B and 3B are an Al/Si stacked film, an Al/Si/Cu stacked film, or the like, for example.

A drain electrode 19 is formed on the back surface of the n⁺ type substrate 4 so as to cover the entirety thereof. The drain electrode 19 is common to all the unit cells C. In the semiconductor device 1 according to the first embodiment, the gate pad 2 is disposed at the center portion of one surface of the semiconductor device 1. In addition, the gate electrode 11 of the unit cells C (the center-side unit cells Cc) that are proximate to the gate pad 2, among the plurality of unit cells C disposed in the radial direction about the gate pad 2, is electrically connected to the gate pad 2 via the gate wiring film 14. The gate electrodes 11 of the unit cells C that are adjacent to each other in the radial direction are connected to each other.

Thus, with the semiconductor device 1 according to the first embodiment, it is possible to reduce the gate wiring length (gate electrode length) from the gate pad 2 to the unit cell C that is the most distant from the gate pad 2 compared to the semiconductor device according to the related art in which the gate pad is formed at one corner portion of one surface or the center portion of an edge portion along one side of the surface. Consequently, it is possible to reduce the time for propagation of a gate input signal to the unit cells C that are distant from the gate pad 2, and thus to reduce the time of delay in output in response to the gate input signal.

Figure 4:
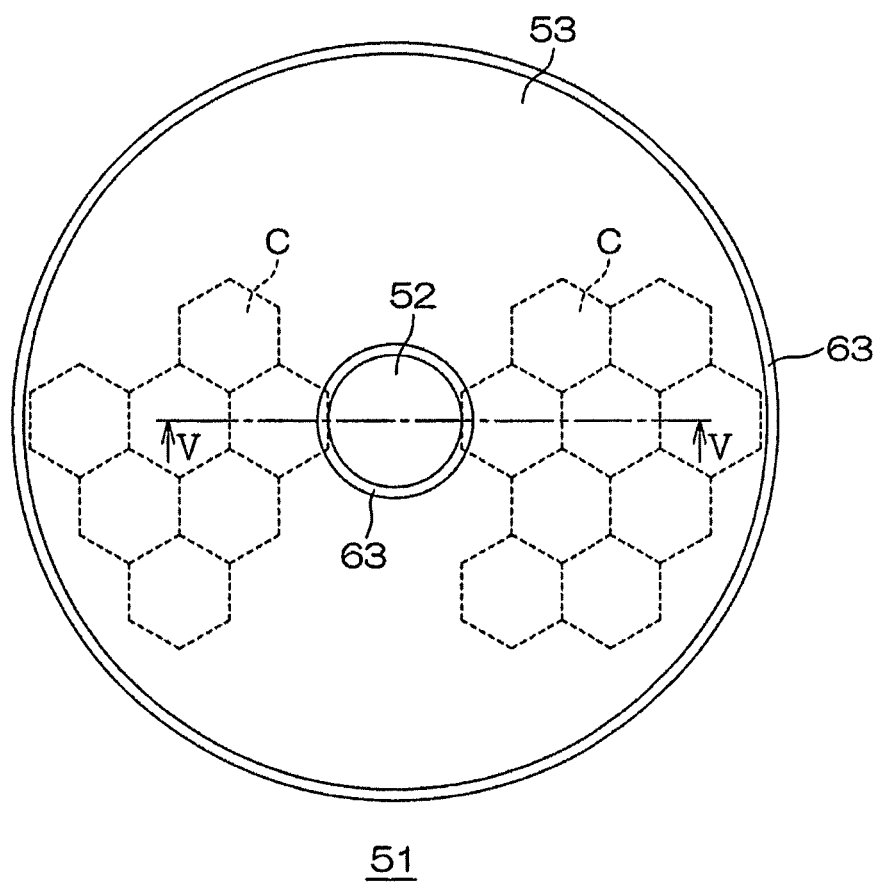
FIG. 4 is a schematic plan view of a semiconductor device according to a second embodiment of the present invention.
Figure 5:
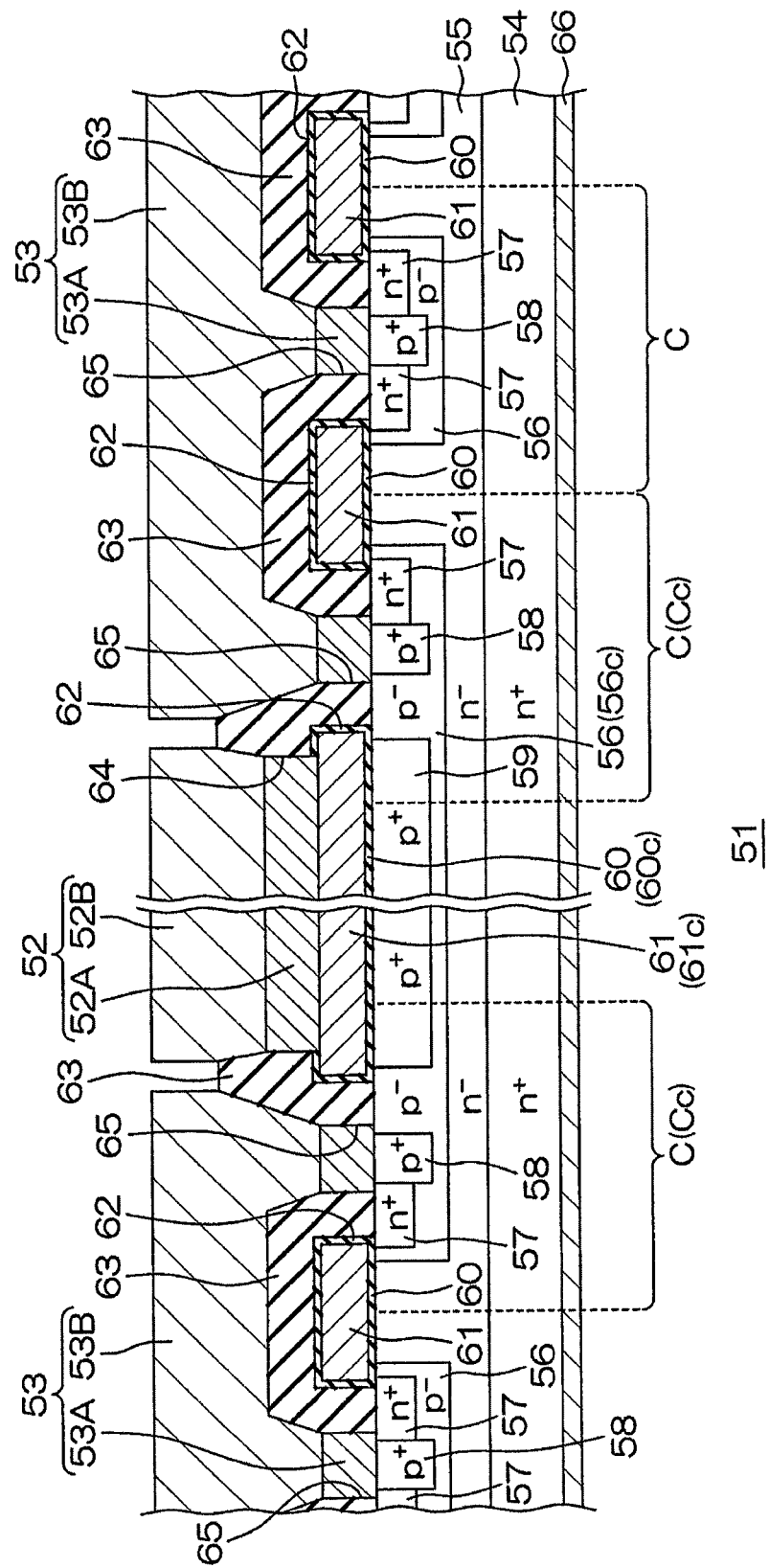
FIG. 5 is a schematic partial enlarged sectional view taken along the line V-V of FIG. 4.
Figure 6:
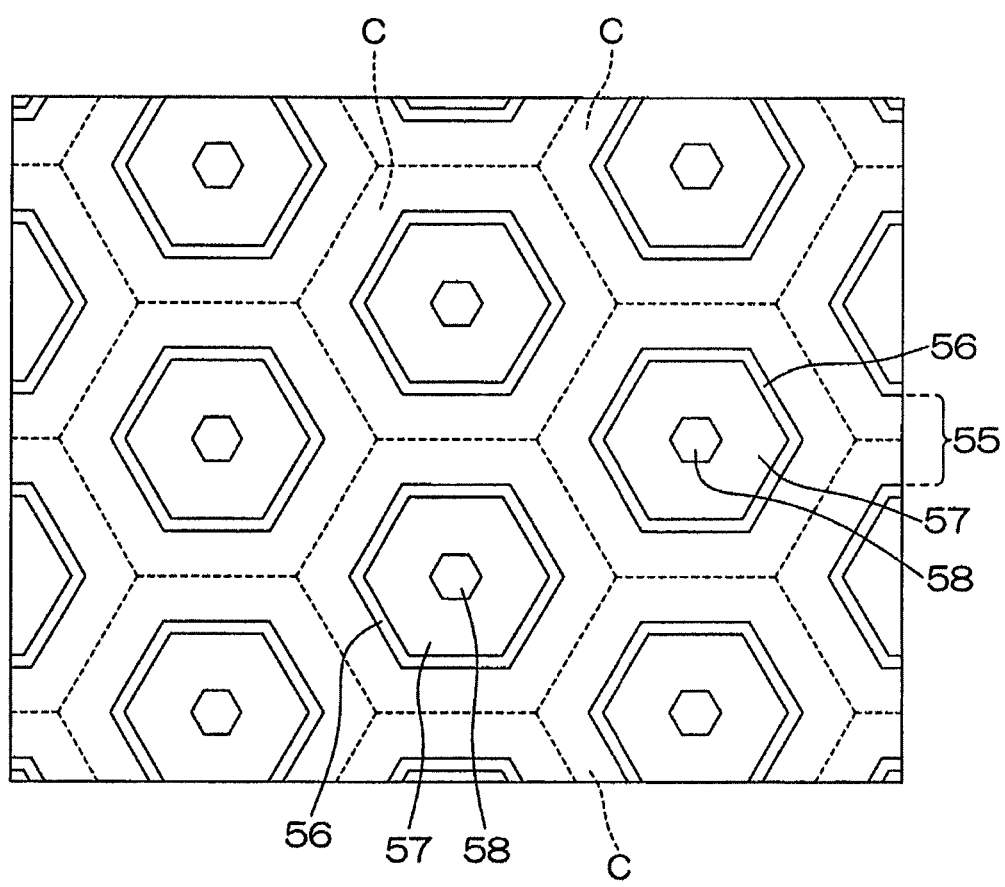
FIG. 6 is a schematic partial enlarged plan view illustrating the layout of unit cells.

FIG. 4 is a schematic plan view of a semiconductor device according to a second embodiment of the present invention. FIG. 5 is a schematic partial enlarged sectional view taken along the line V-V of FIG. 4. FIG. 6 is a schematic partial enlarged plan view illustrating the layout of unit cells. It should be noted, however, that components formed on an n type epitaxial layer 55 (see FIG. 5) are not illustrated in FIG. 6. A semiconductor device 51 is a planar type MOSFET, and has the shape of a circular chip as viewed in plan. A gate pad 52 is formed at the center portion of the surface of the semiconductor device 51. The gate pad 52 has a circular shape as viewed in plan. The center of the gate pad 52 coincides with the center of the surface of the semiconductor device 51. A source pad 53 is formed on the surface of the semiconductor device 51 so as to surround the gate pad 52. The source pad 53 has a circular ring shape as viewed in plan. The center of the source pad 53 coincides with the center of the surface of the semiconductor device 51. A clearance is provided between the gate pad 52 and the source pad 53 so that the gate pad 52 and the source pad 53 are insulated from each other.

A plurality of unit cells C of the planar type MOSFET element are provided below the source pad 53. Each of the unit cells C has a regular hexagonal shape as viewed in plan. The plurality of unit cells C are arranged in the radial direction about the gate pad 52 as viewed in plan. In other words, the plurality of unit cells C are disposed in a honeycomb structure. A unit cell C that is proximate to the gate pad 52, in each row of unit cells disposed in the radial direction about the gate pad 52 as viewed in plan, is occasionally referred to as "center-side unit cell Cc". The actual size of the unit cells C with respect to the semiconductor device 51 is smaller than the size of the unit cells C illustrated in FIG. 4. Thus, the actual number of unit cells C formed in the semiconductor device 51 is much larger than the number of the unit cells C illustrated in FIG. 4.

The semiconductor device 51 includes an n⁺ type substrate 54 made of Si, and an n⁻ type epitaxial layer 55 formed on the n⁺ type substrate 54 and made of Si. In the second embodiment, the n⁺ type substrate 54 and the n⁻ type epitaxial layer 55 compose the "semiconductor layer" according to the present invention. The semiconductor layer has a circular shape as viewed in plan. The plurality of unit cells C are arranged in the surface layer portion of the n⁻ type epitaxial layer 55.

Each of the unit cells C includes a p⁻ type well 56, an n⁺ type source region 57, and a p⁺ type contact region 58. The p⁻ type well 56 is formed in the surface layer portion of the n⁻ type epitaxial layer 55. The p⁻ type well 56 of the unit cells C is formed in a regular hexagonal shape that is analogous to that of the corresponding unit cell C as viewed in plan, for example. It should be noted, however, that the p⁻ type well 56 of the plurality of center-side unit cells Cc is formed integrally with the p⁻ type well 56 formed in a region surrounded by the center-side unit cells Cc. It the following description, the p⁻ type well 56 formed in the region surrounded by the plurality of center-side unit cells Cc and the p⁻ type well 56 of the plurality of center-side unit cells Cc are occasionally referred to comprehensively as "common p⁻ type well 56c".

The n⁺ type source region 57 of the unit cells C is formed in the surface layer portion of the p⁻ type well 56 in a region located inwardly of the corresponding p⁻ type well 56. The n⁺ type source region 57 of the unit cells C other than the center-side unit cells Cc is formed in a regular hexagonal ring shape that is analogous to that of the corresponding p⁻ type well 56 as viewed in plan, for example. The n⁺ type source region 57 of the center-side unit cells Cc is formed along sides of the corresponding p⁻ type well 56, among the six sides of the p⁻ type well 56, other than the side on the gate pad 52 side as viewed in plan, and formed in a partially missing regular hexagonal ring shape (regular hexagonal ring shape with ends).

The p⁺ type contact region 58 of the unit cells C other than the center-side unit cells Cc is formed in a region surrounded by the n⁺ type source region 57 in the surface layer portion of the corresponding p⁻ type well 56. The p⁺ type contact region 58 of the center-side unit cells Cc is formed in a region substantially surrounded by the n⁺ type source region 57 in the surface layer portion of the corresponding p⁻ type well 56. A p⁺ region 59 is formed at the center portion of the surface layer portion of the common p⁻ type well 56c. The p⁺ region 59 has a portion that extends into the center-side unit cells Cc.

A gate insulating film 60 is formed on the surface of the n⁻ type epitaxial layer 55 along the boundary between the unit cells C. The gate insulating film 60 includes a gate insulating film 60 formed so as to cover the p⁺ region 59 (hereinafter occasionally referred to as "common gate insulating film 60c"). A part of the common gate insulating film 60c composes the gate insulating film 60 formed along the side of the center-side unit cells Cc that is proximate to the gate pad 52. The gate insulating film 60 other than the common gate insulating film 60c extends across adjacent unit cells C, and covers a portion of the p⁻ type well 56 that surrounds the source region 57 and the outer peripheral edge of the source region 57.

A gate electrode 61 is formed on the gate insulating film 60. The gate electrode 61 is made of polysilicon doped with impurities, for example. In the following description, a portion of the gate electrode 61 that is formed on the common gate insulating film 60c is occasionally referred to as "common gate electrode 61c". The gate electrode 61 is spread in the shape of a net having meshes in a regular hexagonal ring shape about the common gate electrode 61c as viewed in plan. The gate electrode 61 in a regular hexagonal ring shape as viewed in plan surrounds the p⁻ type well 56 of the unit cells C.

An insulating film 62 is formed so as to cover the gate electrode 61. The insulating film 62 is integrated with the gate insulating film 60. Further, an interlayer insulating film 63 is formed so as to cover a part of the n⁺ type source region 57 and the insulating films 60 and 62. A gate contact hole 64 is formed in the interlayer insulating film 63 and the insulating film 62 formed on the common gate electrode 61c to penetrate the interlayer insulating film 63 and the insulating film 62. The gate contact hole 64 is formed substantially at the center of the common gate electrode 61c as viewed in plan, and formed so as to expose a part of the common gate electrode 61c.

A source contact hole 65 is formed in the interlayer insulating film 63 to penetrate the interlayer insulating film 63. The source contact hole 65 is formed substantially at the center of the p⁻ type well 56 of the unit cells C as viewed in plan, and formed so as to expose the p⁺ type contact region 58 and a part of the n⁺ type source region 57. The gate pad 52 and the source pad 53 are formed on the interlayer insulating film 63. In other words, the gate pad 52 and the source pad 53 are disposed on the semiconductor layer 54, 55 composed of the n⁺ type substrate 54 and the n⁻ type epitaxial layer 55. The gate pad 52 is disposed at the center portion of the semiconductor layer 54, 55, and has a circular shape as viewed in plan. The center of the gate pad 52 coincides with the center of the semiconductor layer 54, 55. The source pad 53 is disposed so as to surround the gate pad 52, and has a circular ring shape as viewed in plan. The center of the source pad 53 coincides with the center of the semiconductor layer 54, 55.

The gate pad 52 contacts the common gate electrode 61c via the gate contact hole 64. The common gate electrode 61c is connected to another gate electrode 61. Thus, the gate pad 52 is electrically connected to the gate electrodes 61 corresponding to all the unit cells C. The gate pad 52 is formed of a contact metal 52A and a surface metal 52B that are stacked such that the contact metal 52A is placed on the common gate electrode 61c and the surface metal 52B is placed on the contact metal 52A.

The source pad 53 collectively contacts the p⁺ type contact region 58 and the n⁺ type source region 57 of all the unit cells C via each source contact hole 65. That is, the source pad 53 is common to all the unit cells C. The source pad 53 is formed of a contact metal 53A and a surface metal 53B that are stacked such that the contact metal 53A is placed on the p⁺ type contact region 58 and the n⁺ type source region 57 and the surface metal 53B is placed on the contact metal 53A. The contact metals 52A and 53A of the gate pad 52 and the source pad 53 are an Al/Si stacked film, W (tungsten), an Al/Si/Cu stacked film, or the like, for example. The surface metals 52B and 53B are an Al/Si stacked film, an Al/Si/Cu stacked film, or the like, for example.

A drain electrode 66 is formed on the back surface of the n⁺ type substrate 54 so as to cover the entirety thereof. The drain electrode 66 is common to all the unit cells C.

In the semiconductor device 51 according to the second embodiment, the gate pad 52 is disposed at the center portion of one surface of the semiconductor device 51. In addition, the gate electrode 61 (common gate electrode 61c) of the unit cells C (the center-side unit cells Cc) that are proximate to the gate pad 52, among the plurality of unit cells C disposed in the radial direction about the gate pad 52, is electrically connected to the gate pad 52. The gate electrodes 61 of the unit cells C that are adjacent to each other in the radial direction are connected to each other.

Thus, with the semiconductor device 51 according to the second embodiment, it is possible to reduce the gate wiring length (gate electrode length) from the gate pad 52 to the unit cell C that is the most distant from the gate pad 52 compared to the semiconductor device according to the related art discussed above. Consequently, it is possible to reduce the time for propagation of a gate input signal to the unit cells C that are distant from the gate pad 52, and thus to reduce the time of delay in output in response to the gate input signal.

Figure 7A:
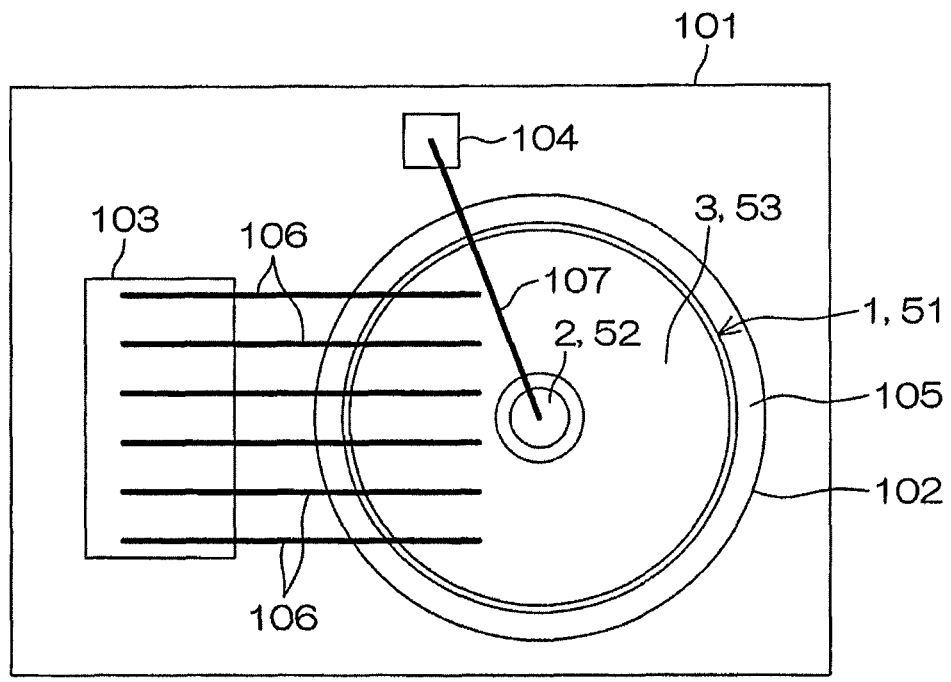
FIG. 7A is a schematic plan view illustrating a state in which the semiconductor device according to the first or second embodiment is mounted on a wiring substrate.
Figure 7B:
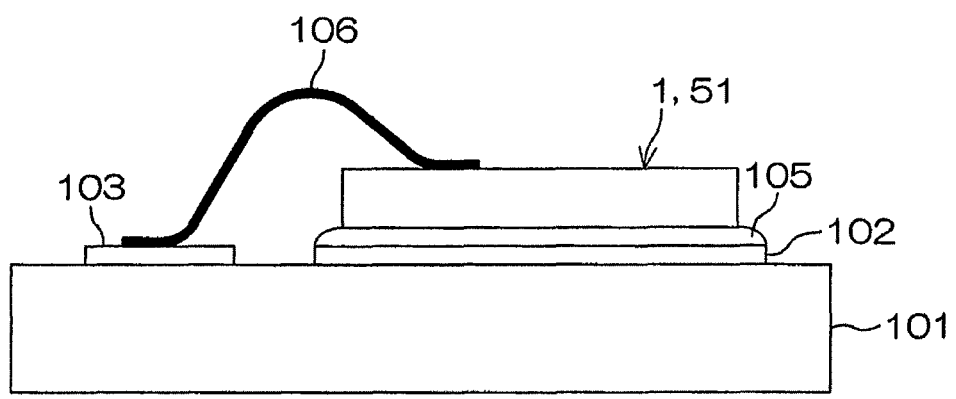
FIG. 7B is a schematic front view of FIG. 7A.

In the case where the semiconductor device 1, 51 according to the first embodiment or the second embodiment discussed above is caused to function as an electronic circuit such as an inverter circuit, a plurality of semiconductor devices are mounted on a wiring substrate on which wiring is formed in advance. FIG. 7A is a schematic plan view illustrating a state in which the semiconductor device 1, 51 according to the first or second embodiment discussed above is mounted on a wiring substrate. FIG. 7B is a schematic front view of FIG. 7A. In FIGS. 7A and 7B, for convenience of description, one semiconductor device 1, 51 is mounted on the wiring substrate.

A wiring substrate 101 is formed in the shape of a rectangle that is longer in one direction as viewed in plan. A drain metal pattern 102, a source metal pattern 103, and a gate metal pattern 104 are formed on one surface of the wiring substrate 101. The source metal pattern 103 and the drain metal pattern 102 are disposed with a clearance therebetween in the direction along the long sides of the wiring substrate 101 as viewed in plan. The source metal pattern 103 is disposed near one of the short sides of the wiring substrate 101, and has the shape of a rectangle that is longer in the direction that is parallel to the short sides of the wiring substrate 101 as viewed in plan. The drain metal pattern 102 is disposed between the source metal pattern 103 and the other of the short sides of the wiring substrate 101, and has a circular shape as viewed in plan. The diameter of the drain metal pattern 102 is slightly larger than the diameter of the semiconductor device 1, 51 as viewed in plan. The gate metal pattern 104 has a rectangular shape as viewed in plan, and is disposed in a region between one of the long sides of the wiring substrate 101 and the drain metal pattern 102. The metal patterns 102, 103, and 104 are made of copper or aluminum, for example.

The drain electrode of the semiconductor device 1, 51 is joined onto the drain metal pattern 102 by solder 105. The source pad 3, 53 of the semiconductor device 1, 51 is connected to the source metal pattern 103 by a plurality of bonding wires 106. The gate pad 2, 52 of the semiconductor device 1, 51 is connected to the gate metal pattern 104 by a bonding wire 107. Connection by the bonding wires 106 and 107 is achieved by a wire bonding device, for example.

The joint of the semiconductor device 1, 51 to the drain metal pattern 102 is achieved as follows, for example. That is, solder paste as the material of the solder 105 is applied to the surface of the drain metal pattern 102. Next, the semiconductor device 1, 51 is placed on the solder paste with the drain electrode of the semiconductor device 1, 51 facing the surface of the drain metal pattern 102. After that, the solder paste is heated to melt the solder paste. Consequently, the drain electrode of the semiconductor device 1, 51 is joined to the drain metal pattern 102 via the solder 105.

When joining the drain electrode of the semiconductor device 1, 51 to the drain metal pattern 102 using the solder 105 in this way, the solder in the paste form is melted through heating. Therefore, the semiconductor device 1, 51 may be rotated on the drain metal pattern 102 as the solder flows. In the semiconductor device according to the related art discussed above, in the case where the semiconductor device is rotated when joining the semiconductor device to the drain metal pattern, the positions of a region of the semiconductor device provided with the gate pad and a region of the semiconductor device provided with the source pad with respect to the drain metal pattern are varied. Then, the bonding position of the bonding wire to the gate pad and the source pad (the bonding coordinate set to the wire bonding device) must be corrected in accordance with the rotation of the semiconductor device, which reduces the bonding work efficiency. In an electronic circuit such as an inverter circuit in which a plurality of semiconductor devices are mounted on a wiring substrate, in particular, it may be necessary that the bonding position should be corrected for each of the semiconductor devices, which may significantly reduce the bonding work efficiency.

In the semiconductor device 1, 51 according to the first embodiment or the second embodiment discussed above, in contrast, the gate pad 2, 52 is disposed at the center portion of the surface of the semiconductor device 1, 51, and the source pad 3, 53 is disposed so as to surround the gate pad 2, 52. In addition, the gate pad 2, 52 is formed in the shape of a circle centered on the center of the surface of the semiconductor device 1, 51 as viewed in plan, and the source pad 3, 53 is formed in the shape of a circular ring centered on the center of the surface of the semiconductor device 1, 51 as viewed in plan.

Therefore, even if the semiconductor device 1, 51 is rotated when joining the semiconductor device 1, 51 to the drain metal pattern 102, the positions of a region of the semiconductor device 1, 51 provided with the gate pad 2, 52 and a region of the semiconductor device 1, 51 provided with the source pad 3, 53 with respect to the drain metal pattern 102 are hardly varied. Therefore, even in the case where the semiconductor device 1, 51 is rotated when mounting the semiconductor device 1, 51 onto the wiring substrate 101, it is possible to eliminate the need to correct the bonding position of the bonding wires 107 and 106 to the gate pad 2, 52 and the source pad 3, 53 as much as possible. Consequently, the bonding work efficiency in joining the bonding wires 107 and 106 to the gate pad 2, 52 and the source pad 3, 53 of the semiconductor device 1, 51 is improved. A similar effect is achieved in the case where a frame-like connection metal member is used in place of the bonding wires 107 and 106.

Figure 8:
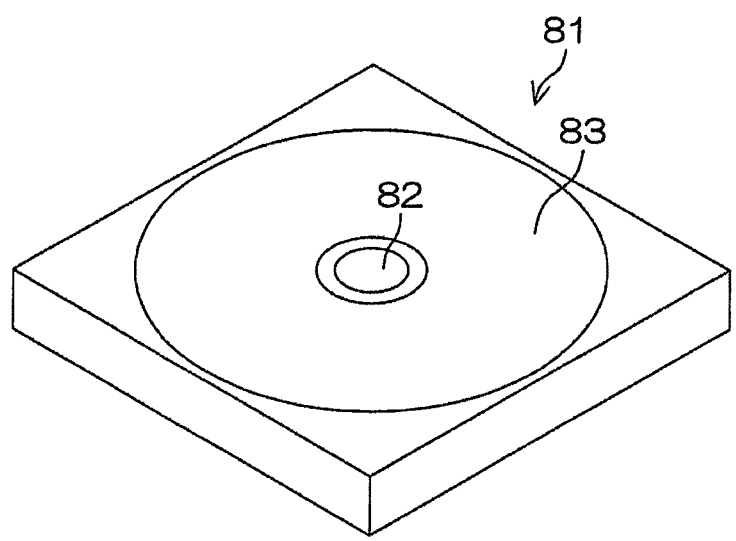
FIG. 8 is a schematic perspective view illustrating a semiconductor device according to a third embodiment.

FIG. 8 is a schematic perspective view illustrating a semiconductor device according to a third embodiment of the present invention. A semiconductor device 81 has the shape of a square chip as viewed in plan. A gate pad 82 is formed at the center portion of the surface of the semiconductor device 81. The gate pad 82 has the shape of a circle centered on the center of the surface of the semiconductor device 81 as viewed in plan. A source pad 83 is formed on the surface of the semiconductor device 81 so as to surround the gate pad 82. The source pad 83 has the shape of a circular ring centered on the center of the surface of the semiconductor device 81 as viewed in plan. A clearance is provided between the gate pad 82 and the source pad 83 so that the gate pad 82 and the source pad 83 are insulated from each other. A drain electrode (not illustrated) is formed on the back surface of the semiconductor device 81.

Figure 9A:
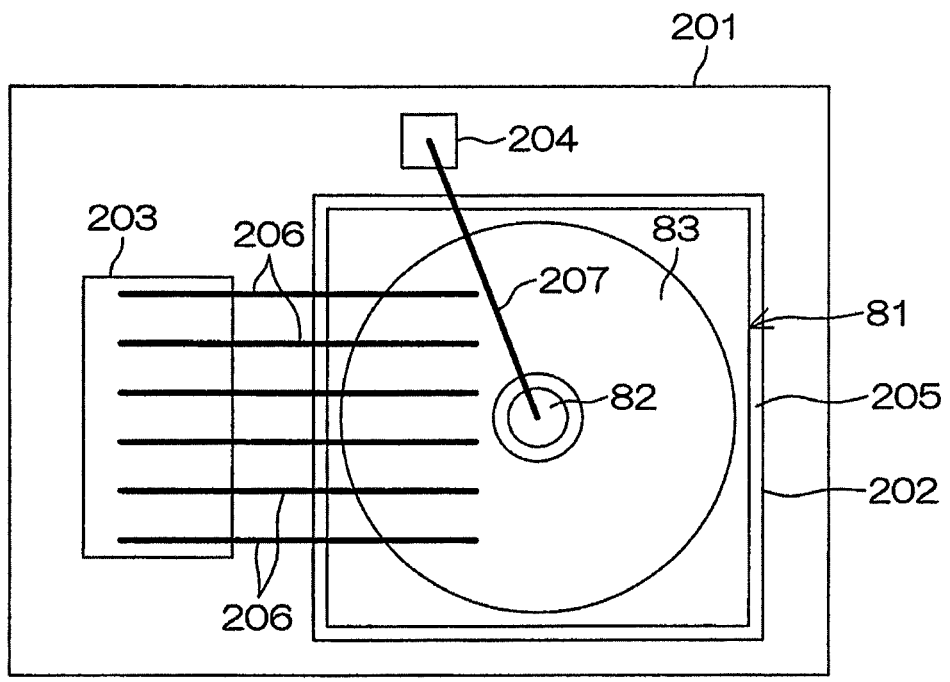
FIG. 9A is a schematic plan view illustrating a state in which the semiconductor device according to the third embodiment is mounted on a wiring substrate.
Figure 9B:
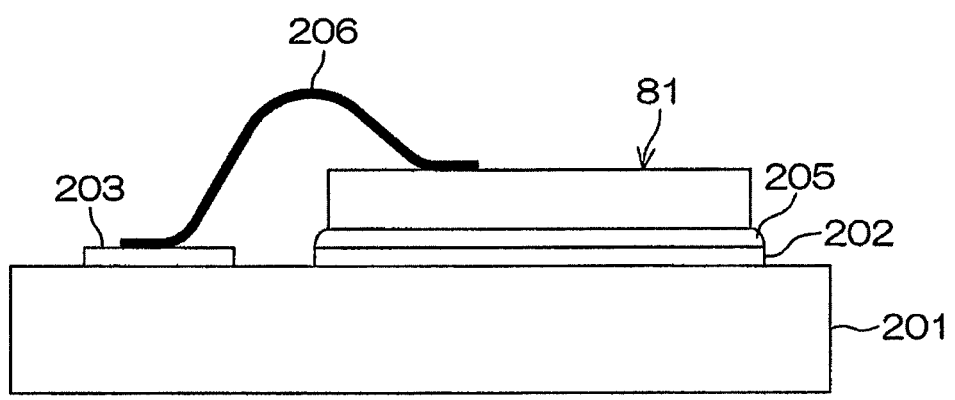
FIG. 9B is a schematic front view of FIG. 9A.

The internal structure of the semiconductor device 81 is similar to the internal structure of the semiconductor device 1, 51 according to the first or second embodiment discussed above except that the semiconductor layer included in the semiconductor device 81 has a square shape as viewed in plan, and thus is not described. FIG. 9A is a schematic plan view illustrating a state in which the semiconductor device 81 of FIG. 8 is mounted on a wiring substrate. FIG. 9B is a schematic front view of FIG. 9A. In FIGS. 9A and 9B, for convenience of description, one semiconductor device 81 is mounted on the wiring substrate.

A wiring substrate 201 is formed in the shape of a rectangle that is longer in one direction as viewed in plan. A drain metal pattern 202, a source metal pattern 203, and a gate metal pattern 204 are formed on one surface of the wiring substrate 201. The source metal pattern 203 and the drain metal pattern 202 are disposed with a clearance therebetween in the direction along the long sides of the wiring substrate 201 as viewed in plan. The source metal pattern 203 is disposed near one of the short sides of the wiring substrate 201, and has the shape of a rectangle that is longer in the direction that is parallel to the short sides of the wiring substrate 201 as viewed in plan. The drain metal pattern 202 is disposed between the source metal pattern 203 and the other of the short sides of the wiring substrate 201, and has a square shape as viewed in plan. The length of each side of the drain metal pattern 202 is slightly larger than the length of each side of the semiconductor device 81 as viewed in plan. The gate metal pattern 204 has a rectangular shape as viewed in plan, and is disposed in a region between one of the long sides of the wiring substrate 201 and the drain metal pattern 202. The metal patterns 202, 203, and 204 are made of copper or aluminum, for example.

The drain electrode of the semiconductor device 81 is joined onto the drain metal pattern 202 by solder 205. In the example of FIGS. 9A and 9B, the solder 205 is spread over the entire upper surface of the drain metal pattern 202. The source pad 83 of the semiconductor device 81 is connected to the source metal pattern 203 by a plurality of bonding wires 206. The gate pad 82 of the semiconductor device 81 is connected to the gate metal pattern 204 by a bonding wire 207. Connection by the bonding wires 206 and 207 is achieved by a wire bonding device, for example.

Also in such a configuration, the semiconductor device 81 may be rotated when joining the semiconductor device 81 to the drain metal pattern 202. Even if the semiconductor device 81 is rotated, however, the positions of a region of the semiconductor device 81 provided with the gate pad 82 and a region of the semiconductor device 81 provided with the source pad 83 with respect to the drain metal pattern 202 are hardly varied. Therefore, even in the case where the semiconductor device 81 is rotated when mounting the semiconductor device 81 onto the wiring substrate 201, it is possible to eliminate the need to correct the position of bonding the bonding wires 207 and 206 to the gate pad 82 and the source pad 83 as much as possible. Consequently, the bonding work efficiency in joining the bonding wires 207 and 206 to the gate pad 82 and the source pad 83 of the semiconductor device 81 is improved.

Figure 10:
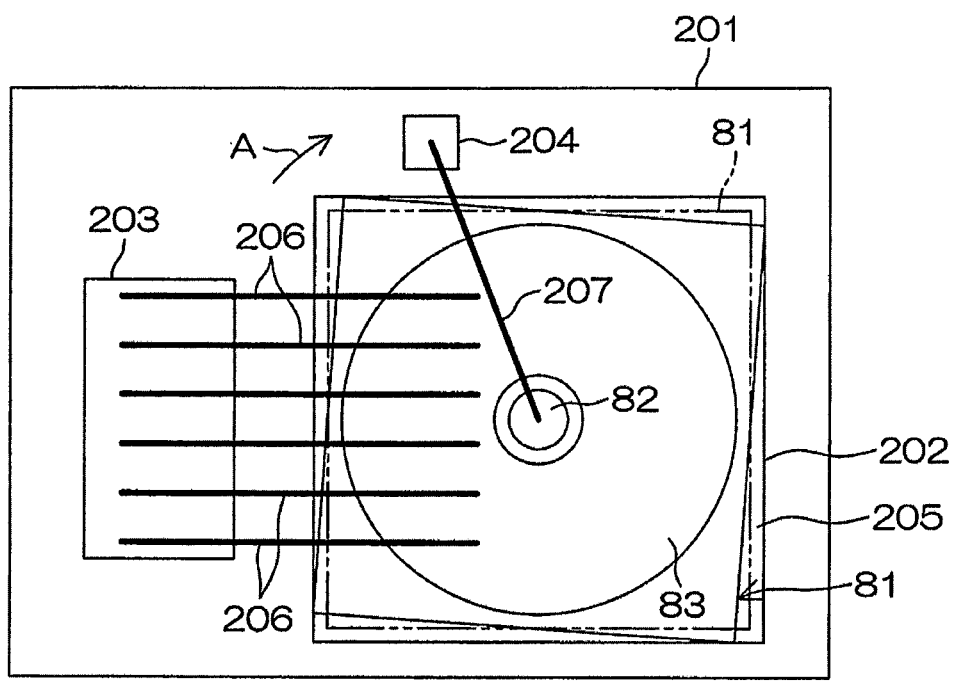
FIG. 10 is a schematic plan view illustrating that the amount of rotation of the semiconductor device according to the third embodiment that occurs when mounting the semiconductor device onto a wiring substrate is restricted.

Further, the semiconductor device 81 has a square shape as viewed in plan, and the drain metal pattern 202 also has a square shape as viewed in plan. Therefore, the amount of rotation of the semiconductor device 81 that occurs when joining the semiconductor device 81 to the drain metal pattern 202 is restricted compared to a case where the semiconductor device 81 and the drain metal pattern 202 are formed in a circular shape as viewed in plan. For example, in the case where the semiconductor device 81 is rotated in the direction of the arrow A from the state indicated by the long dashed double-short dashed line as illustrated in FIG. 10, the semiconductor device 81 is only rotated to a state in which a corner of the semiconductor device 81 is positioned right above a side of the drain metal pattern 202 (the state indicated by the continuous line). This is because the surface tension of the solder paste in the molten state on the drain metal pattern 202 suppresses protrusion of the semiconductor device 81 to the outside of the surface of the drain metal pattern 202.

Although the first to third embodiments of the present invention have been described above, the present invention may be implemented in different forms. For example, the present invention may also be applied to a semiconductor device such as an MOSFET in which a gate pad and a drain pad are formed on one surface. In this case, the shape and the arrangement of the gate pad as viewed in plan are the same as the shape and the arrangement of the gate pad 2, 52, 82 in the first to third embodiments discussed above. The shape and the arrangement of the drain pad are the same as the shape and the arrangement of the source pad 3, 53, 83 in the first to third embodiments discussed above.

In addition, the present invention may also be applied to an IGBT in which a gate pad and an emitter pad are formed on one surface. In this case, the gate pad of the IGBT corresponds to the gate pad 2, 52, 82 in the first to third embodiments discussed above, and the emitter pad of the IGBT corresponds to the source pad 3, 53, 83 in the first to third embodiments discussed above. In addition, the present invention may also be applied to an IGBT in which a gate pad and a collector pad are formed on one surface. In this case, the shape and the arrangement of the gate pad of the IGBT as viewed in plan are the same as the shape and the arrangement of the gate pad 2, 52, 82 in the first to third embodiments discussed above. The shape and the arrangement of the collector pad of the IGBT are the same as the shape and the arrangement of the source pad 3, 53, 83 in the first to third embodiments discussed above.

In the first to third embodiments discussed above, in addition, the unit cells have a regular hexagonal shape as viewed in plan. However, the unit cells may also have a shape other than a regular hexagonal shape such as a polygonal shape other than a regular hexagonal shape, a circular shape, or an elliptical shape. Besides, a variety of design changes may be made without departing from the scope described in the claims.

What is claimed is:
1. A semiconductor device comprising:
a semiconductor layer;
a plurality of unit cells formed in the semiconductor layer to each compose a transistor element that is a metal oxide semiconductor (MOS) field effect transistor element;
a gate pad disposed on the semiconductor layer and having a shape of a circle centered on a center of the semiconductor layer as viewed in plan from a thickness direction of the semiconductor layer; and
a main electrode pad disposed on the semiconductor layer so as to surround the gate pad and having a shape of a circular ring centered on the center of the semiconductor layer as viewed in plan, wherein
the main electrode pad is a source pad,
the unit cells each have a regular hexagonal shape as viewed in plan,
a source region of the unit cells other than the unit cells proximate to the gate pad is formed in a regular hexagonal ring shape as viewed in plan, and a source region of the unit cells proximate to the gate pad is formed in a partially missing regular hexagonal ring shape as viewed in plan.
2. The semiconductor device according to claim 1, wherein
the plurality of unit cells are arranged in a radial direction about the gate pad as viewed in plan; and
a gate electrode of a unit cell that is proximate to the gate pad, among the plurality of unit cells arranged in the radial direction, is electrically connected to the gate pad, and gate electrodes of unit cells that are adjacent to each other in the radial direction are connected to each other.

* * * * *